US012813166B2

(12) United States Patent
Ting et al.

(10) Patent No.: US 12,813,166 B2
(45) Date of Patent: Nov. 24, 2026

(54) RESISTIVE SWITCHING DEVICE AND FABRICATION METHOD THEREOF

(71) Applicant: UNITED MICROELECTRONICS CORP., Hsin-Chu City (TW)

(72) Inventors: Yen-Min Ting, Tainan City (TW); Chuan-Fu Wang, Miaoli County (TW); Yu-Huan Yeh, Hsinchu City (TW)

(73) Assignee: UNITED MICROELECTRONICS CORP., Hsin-Chu City (TW)

(*) Notice: Subject to any disclaimer, the term of this patent is extended or adjusted under 35 U.S.C. 154(b) by 664 days.

(21) Appl. No.: 18/221,385

(22) Filed: Jul. 12, 2023

(65) Prior Publication Data

US 2025/0008849 A1 Jan. 2, 2025

(30) Foreign Application Priority Data

Jun. 27, 2023 (TW) ................................ 112123856

(51) Int. Cl.
*H10N 70/00* (2023.01)
*H10B 63/00* (2023.01)
*H10N 70/20* (2023.01)

(52) U.S. Cl.
CPC ........... *H10N 70/841* (2023.02); *H10B 63/00* (2023.02); *H10N 70/011* (2023.02); *H10N 70/24* (2023.02); *H10N 70/8265* (2023.02); *H10N 70/8833* (2023.02)

(58) Field of Classification Search
CPC ............. H10N 70/841; H10N 70/8265; H10N 70/8833
See application file for complete search history.

(56) References Cited

U.S. PATENT DOCUMENTS

| | | | | |
|---|---|---|---|---|
| 11,005,037 B2 | 5/2021 | Liu | | |
| 2010/0038791 A1* | 2/2010 | Lee | H10N 70/041 | 257/E29.143 |
| 2022/0328758 A1* | 10/2022 | Yin | H01L 21/7684 | |
| 2023/0102165 A1* | 3/2023 | Dutta | H10B 61/00 | 257/427 |

* cited by examiner

*Primary Examiner* — Shih Tsun A Chou
(74) *Attorney, Agent, or Firm* — Winston Hsu

(57) ABSTRACT

A resistive switching device includes a substrate, a first dielectric layer on the substrate, a conductive via in the first dielectric layer, a bottom electrode on the conductive via and the first dielectric layer, a resistive switching layer on the bottom electrode, a spacer covering a sidewall of the resistive switching layer and a sidewall of the bottom electrode, and a top electrode capping the spacer and the resistive switching layer.

18 Claims, 5 Drawing Sheets

RESISTIVE SWITCHING DEVICE AND FABRICATION METHOD THEREOF

BACKGROUND OF THE INVENTION

1. Field of the Invention

The invention relates to the field of semiconductor technology, in particular to a resistive switching device and a manufacturing method thereof.

2. Description of the Prior Art

Resistive random access memory (RRAM) is a memory structure including an array of RRAM cells each of which stores a bit of data using resistance values, rather than electronic charge. Particularly, each RRAM cell includes a resistive-switching material layer, the resistance of which can be adjusted to represent logic “0” or logic “1”.

In advanced technology nodes, the feature size scales down and the size of memory devices is reduced accordingly. However, the reduction of the RRAM devices is limited due to the “forming” operation. In the “forming” process, a high voltage is applied to the RRAM device to generate a conductive path in the resistive-switching material layer.

SUMMARY OF THE INVENTION

It is one object of the present invention to provide an improved resistive switching device and its manufacturing method in order to solve the deficiencies or shortcomings of the prior art.

One aspect of the invention provides a resistive switching device including a substrate; a first dielectric layer on the substrate; a conductive via in the first dielectric layer; a bottom electrode on the conductive via and the first dielectric layer; a resistive switching layer on the bottom electrode; a spacer covering a sidewall of the resistive switching layer and a sidewall of the bottom electrode; and a top electrode capping the spacer and the resistive switching layer.

According to some embodiments, the conductive via comprises tungsten.

According to some embodiments, the bottom electrode comprises TaN, TiN, Pt, Ir, Ru, or W.

According to some embodiments, the top electrode comprises TiN, TaN, Pt, Ir, or W.

According to some embodiments, the resistive switching layer comprises a hafnium oxide layer and a titanium layer.

According to some embodiments, the top electrode has an inverted U shaped sectional profile and covers an entire sidewall of the spacer.

According to some embodiments, the spacer has an L-shaped sectional profile.

According to some embodiments, the spacer comprises silicon nitride.

According to some embodiments, the resistive switching device further includes a second dielectric layer on the top electrode; and a contact penetrating through the second dielectric layer and being electrically connected with the top electrode.

According to some embodiments, the contact is not in direct contact with the spacer.

Another aspect of the invention provides a method for forming a resistive switching device. A substrate is provided. A first dielectric layer is formed on the substrate. A conductive via is formed in the first dielectric layer. A bottom electrode is formed on the conductive via and the first dielectric layer. A resistive switching layer is formed on the bottom electrode. A spacer is formed to cover a sidewall of the resistive switching layer and a sidewall of the bottom electrode. A top electrode is formed to cap the spacer and the resistive switching layer.

According to some embodiments, the conductive via comprises tungsten.

According to some embodiments, the bottom electrode comprises TaN, TiN, Pt, Ir, Ru, or W.

According to some embodiments, the top electrode comprises TIN, TaN, Pt, Ir, or W.

According to some embodiments, the resistive switching layer comprises a hafnium oxide layer and a titanium layer.

According to some embodiments, the top electrode has an inverted U shaped sectional profile and covers an entire sidewall of the spacer.

According to some embodiments, the spacer has an L-shaped sectional profile.

According to some embodiments, the spacer comprises silicon nitride.

According to some embodiments, the method further includes the steps of forming a second dielectric layer on the top electrode; and forming a contact penetrating through the second dielectric layer, wherein the contact is electrically connected with the top electrode.

According to some embodiments, the contact is not in direct contact with the spacer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
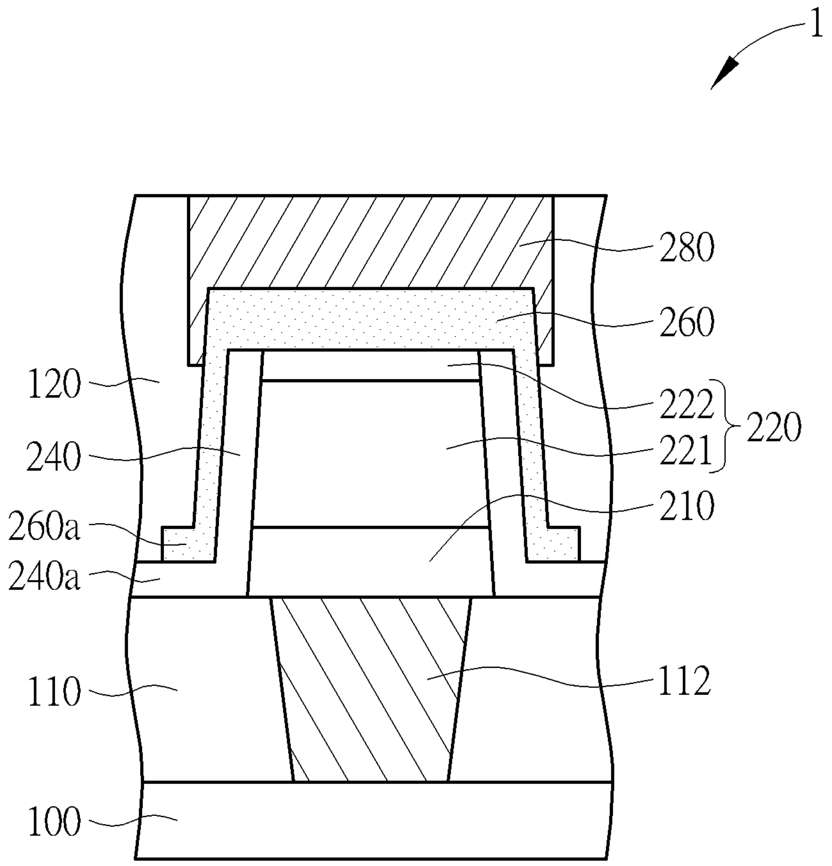
FIG. 1 is a schematic cross-sectional view of a resistive switching device according to an embodiment of the present invention.

Please refer to FIG. 1, which is a schematic cross-sectional view of a resistive switching device according to an embodiment of the present invention. As shown in FIG. 1, a resistive switching device 1, such as a resistive random access memory (RRAM) device, includes a substrate 100 and a first dielectric layer 110 and a second dielectric layer 120 formed on the substrate 100. According to an embodiment of the present invention, the substrate 100 may be a silicon substrate, but is not limited thereto. For the sake of simplicity, various circuit structures formed in the substrate 100, such as transistors, insulating structures, metal interconnections, etc., are not shown in FIG. 1. According to an embodiment of the present invention, the first dielectric layer 110 may include a silicon oxide layer, for example, a TEOS silicon oxide layer, but is not limited thereto. According to an embodiment of the present invention, for example, the second dielectric layer 120 may include a low dielectric constant material, but is not limited thereto.

According to an embodiment of the present invention, a conductive via 112 is formed in the first dielectric layer 110. According to an embodiment of the present invention, the conductive via 112 may include tungsten, but is not limited thereto. According to an embodiment of the present invention, the conductive via 112 may be a tungsten via. A bottom electrode 210 and a resistive switching layer 220 are formed on the conductive via 112 and the first dielectric layer 110. According to an embodiment of the present invention, the bottom electrode 210 may include TaN, TiN, Pt, Ir, Ru or W. According to an embodiment of the present invention, for example, the resistive switching layer 220 may include a hafnium oxide ($HfO_2$) layer 221 and a titanium (Ti) layer 222, but is not limited thereto.

According to an embodiment of the present invention, the resistive switching device 1 further includes a spacer 240 covering the sidewalls of the resistive switching layer 220 and the sidewalls of the bottom electrode 210. According to an embodiment of the present invention, the sidewalls of the resistive switching layer 220 and the sidewalls of the bottom electrode 210 may be continuously inclined sidewalls. According to an embodiment of the present invention, the spacer 240 includes silicon nitride, but is not limited thereto. According to an embodiment of the invention, the spacer 240 does not extend to the top surface of the resistive switching layer 220. According to an embodiment of the present invention, the spacer 240 may have a horizontal section 240*a* extending to the top surface of the first dielectric layer 110. According to an embodiment of the present invention, the spacer 240 may have an L-shaped cross-sectional profile.

According to an embodiment of the present invention, the resistive switching device 1 further includes a top electrode 260 covering the spacer 240 and the resistive switching layer 220. According to an embodiment of the present invention, the top electrode 260 directly contacts the resistive switching layer 220. According to an embodiment of the present invention, the top electrode 260 may include TiN, TaN, Pt, Ir or W, but is not limited thereto. For example, top electrode 260 may be a TiN layer. According to an embodiment of the present invention, the top electrode 260 has an inverted U-shaped cross-sectional profile and covers the entire sidewall of the spacer 240. According to an embodiment of the present invention, the top electrode 260 may have a horizontal section 260*a* disposed on the horizontal section 240*a* of the spacer 240. According to an embodiment of the invention, the second dielectric layer 120 surrounds and covers the top electrode 260.

According to an embodiment of the present invention, the resistive switching device 1 further includes a contact 280, such as a copper contact, penetrating through the second dielectric layer 120 and electrically connected to the top electrode 260. According to an embodiment of the invention, the contact 280 is not in direct contact with the spacer 240. According to an embodiment of the present invention, the contact 280 may have an inverted U-shaped cross-sectional profile and cover the top surface and part of the sidewall of the top electrode 260.

Figure 2:
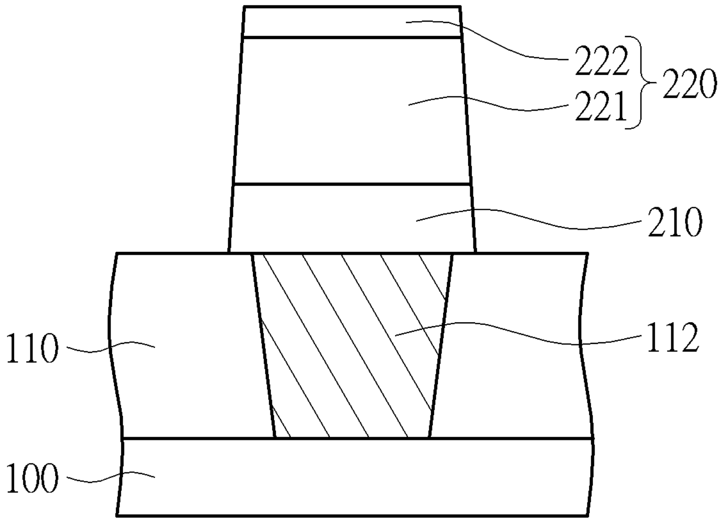
FIG. 2 to FIG. 7 illustrate an exemplary method of forming a resistive switching device.

Please refer to FIG. 2 to FIG. 7, another aspect of the present invention provides a method for forming a resistive switching device. As shown in FIG. 2, firstly, a substrate 100, such as a silicon substrate, is provided. A chemical vapor deposition (CVD) process is then used to form a first dielectric layer 110 on the substrate 100, for example, a silicon oxide layer. A conductive via 112 is then formed in the first dielectric layer 110. According to an embodiment of the present invention, the conductive via 112 may include tungsten, but is not limited thereto. According to an embodiment of the present invention, the conductive via 112 may be a tungsten via. A planarization process, such as a chemical mechanical polishing (CMP) process, may be used to make the top surface of the conductive via 112 flush with the top surface of the first dielectric layer 110.

Subsequently, steps such as deposition process, lithography process, and etching process are performed to form a patterned bottom electrode 210 and a resistive switching layer 220 on the conductive via 112 and the first dielectric layer 110. According to an embodiment of the present invention, the bottom electrode 210 may include TaN, TiN, Pt, Ir, Ru or W. According to an embodiment of the present invention, for example, the resistive switching layer 220 may include a hafnium oxide ($HfO_2$) layer 221 and a titanium (Ti) layer 222, but is not limited thereto.

Figure 3:
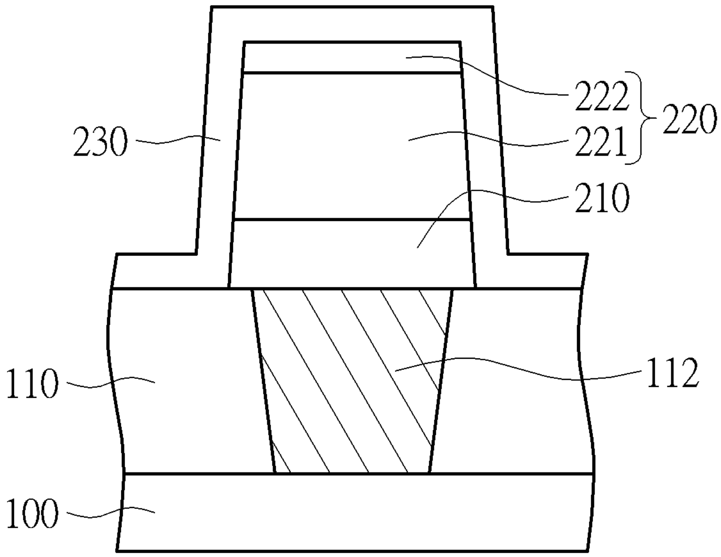

As shown in FIG. 3, a deposition process is performed, and a spacer layer 230 is deposited on the substrate 100 in a blanket manner. According to an embodiment of the present invention, the spacer layer 230 may include a silicon nitride layer, but is not limited thereto.

Figure 4:
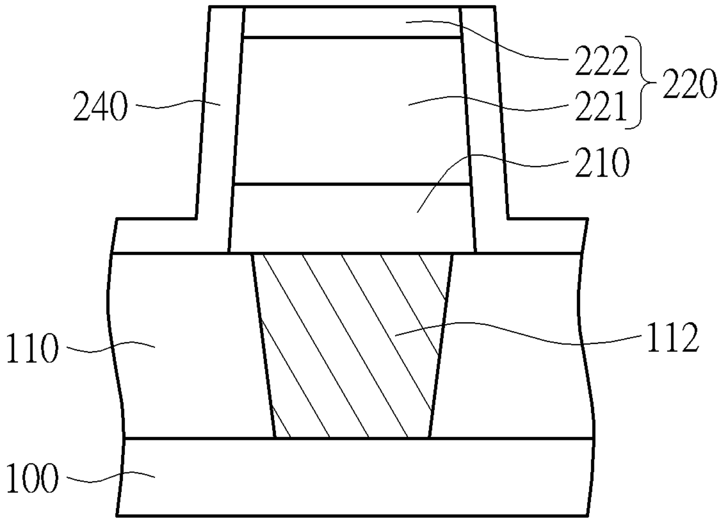

As shown in FIG. 4, an etching process, such as a plasma dry etching process, is performed to remove the spacer layer 230 above the resistive switching layer 220 thereby forming a spacer 240 covering the sidewalls of the resistive switching layer 220 and the sidewalls of the bottom electrode 210. According to an embodiment of the present invention, the spacer 240 has an L-shaped cross-sectional profile. At this point, the titanium layer 222 of the resistive switching layer 220 is exposed.

Figure 5:
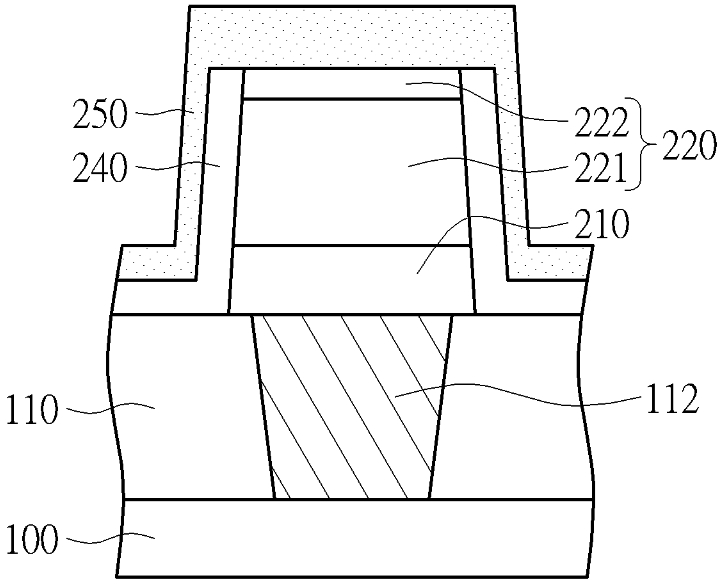

As shown in FIG. 5, a deposition process is performed to form a top electrode layer 250 on the spacer 240 and the resistive switching layer 220. According to an embodiment of the present invention, the top electrode layer 250 may include TiN, TaN, Pt, Ir or W, but is not limited thereto. For example, the top electrode layer 250 may be a TiN layer.

Figure 6:
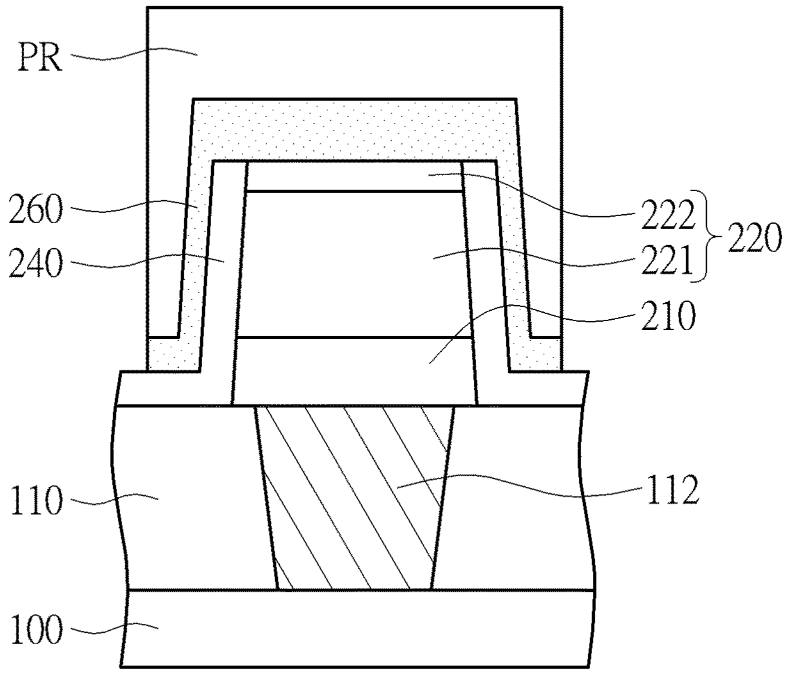

As shown in FIG. 6, the photolithography and etching processes are carried out, the top electrode pattern is defined by the photoresist pattern PR, and the top electrode layer 250 not covered by the photoresist pattern PR is etched away by the plasma dry etching process, thereby forming the top electrode 260. According to an embodiment of the present invention, the top electrode 260 has an inverted U-shaped cross-sectional profile and covers the entire sidewall of the spacer 240. Subsequently, the photoresist pattern PR is removed.

Figure 7:
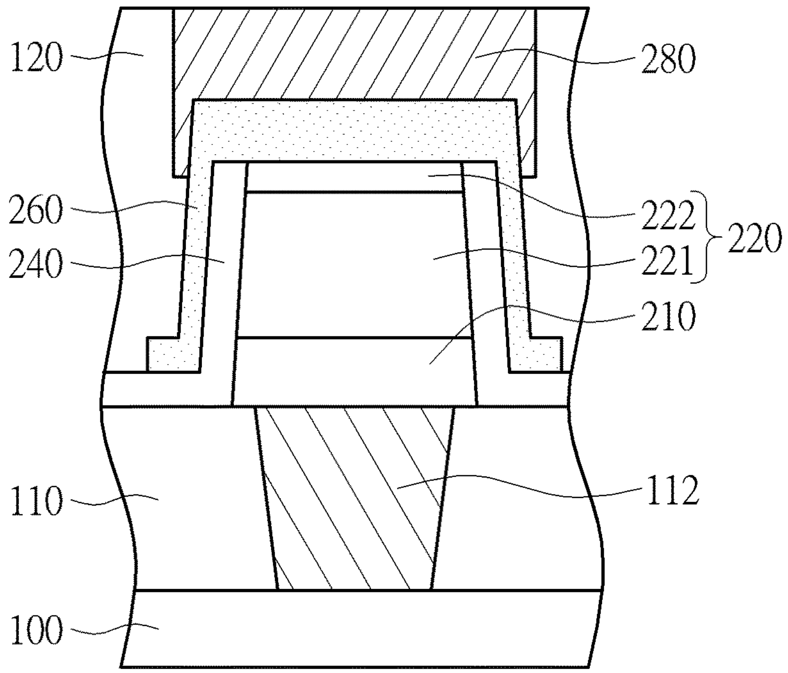

As shown in FIG. 7, a second dielectric layer 120 is formed on the top electrode 260 and on the first dielectric layer 110. According to an embodiment of the present invention, for example, the second dielectric layer 120 may include a low dielectric constant material, but is not limited thereto. A lithography process, an etching process and a metallization process are then performed to form a contact 280 in the second dielectric layer 120 so that the contact 280 is electrically connected to the top electrode 260. According to an embodiment of the invention, the contact 280 is not in direct contact with the spacer 240.

Since the resistive switching layer 220 and the spacer 240 are covered by the top electrode 260 during the process of forming the contact 280, the resistive switching layer 220 can be prevented from being affected by the etching process, thereby improving the process margin of forming the contact 280 and reliability of the resistive switching device 1.

Figure 8:
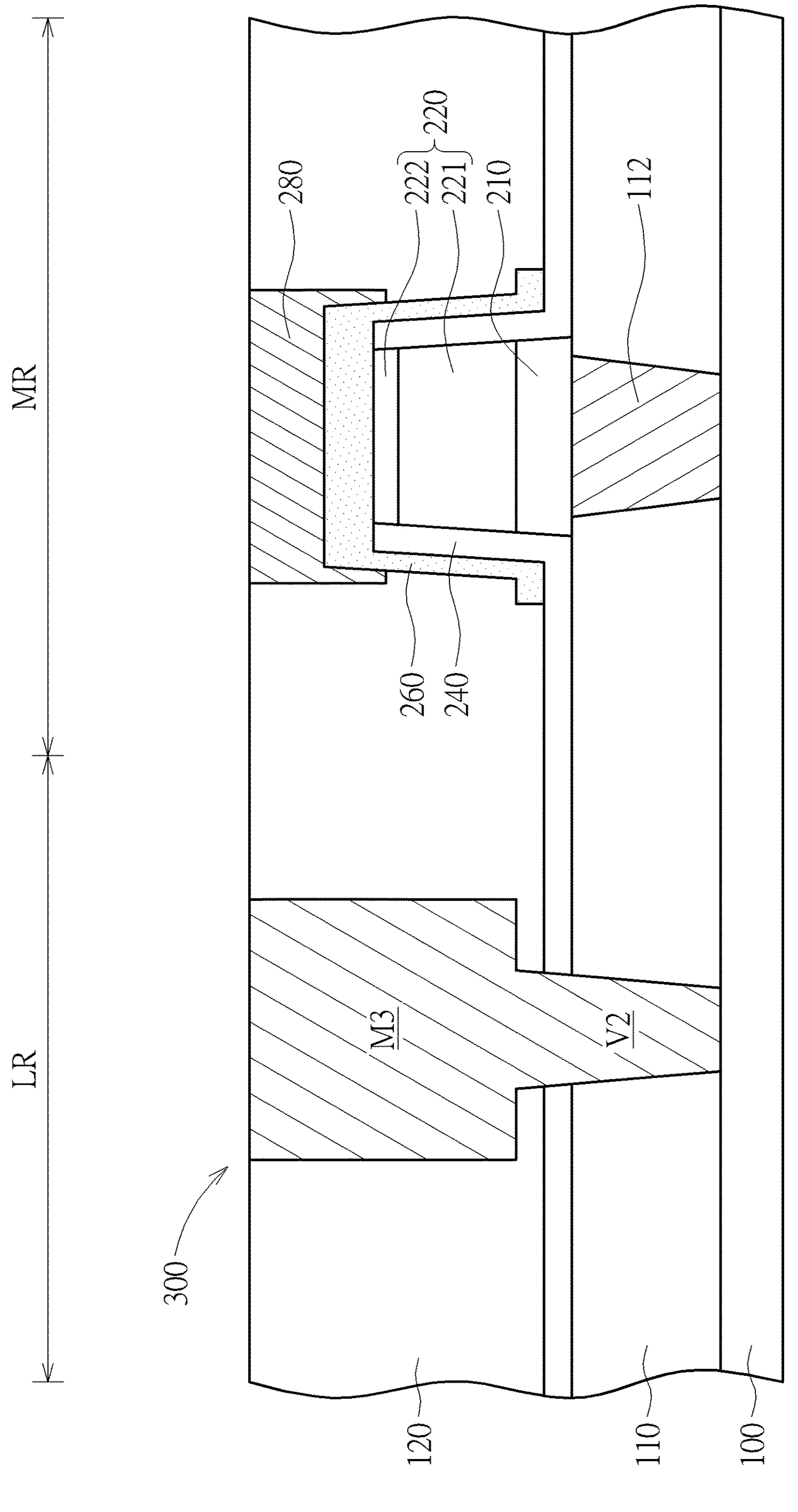
FIG. 8 illustrates the interconnect structure in the logic circuit area and the resistive switching device in the memory area.

FIG. 8 illustrates the interconnect structure in the logic circuit area and the resistive switching device 1 in the memory area. As shown in FIG. 8, the substrate 100 includes a logic circuit region LR and a memory region MR, wherein the logic circuit region LR includes an interconnect structure 300, such as a copper dual damascene structure. For example, the interconnect structure 300 includes a third metal layer M3 and a conductive via V2 connected to the lower metal layer. Both the contact 280 of the resistive switching device 1 and the third metal layer M3 have a trench structure and are formed at the same time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive switching device, comprising:

a substrate;

a first dielectric layer on the substrate;

a conductive via in the first dielectric layer;

a bottom electrode on the conductive via and the first dielectric layer;

a resistive switching layer on the bottom electrode;

a spacer covering a sidewall of the resistive switching layer and a sidewall of the bottom electrode; and a top electrode capping the spacer and the resistive switching layer, wherein the top electrode has an inverted U shaped sectional profile and covers an entire sidewall of the spacer.

2. The resistive switching device according to claim 1, wherein the conductive via comprises tungsten.

3. The resistive switching device according to claim 1, wherein the bottom electrode comprises TaN, TiN, Pt, Ir, Ru, or W.

4. The resistive switching device according to claim 1, wherein the top electrode comprises TiN, TaN, Pt, Ir, or W.

5. The resistive switching device according to claim 1, wherein the resistive switching layer comprises a hafnium oxide layer and a titanium layer.

6. The resistive switching device according to claim 1, wherein the spacer has an L-shaped sectional profile.

7. The resistive switching device according to claim 1, wherein the spacer comprises silicon nitride.

8. The resistive switching device according to claim 1 further comprising:

a second dielectric layer on the top electrode; and a contact penetrating through the second dielectric layer and being electrically connected with the top electrode.

9. The resistive switching device according to claim 8, wherein the contact is not in direct contact with the spacer.

10. A method for forming a resistive switching device, the method comprising:

providing a substrate;

forming a first dielectric layer on the substrate;

forming a conductive via in the first dielectric layer;

forming a bottom electrode on the conductive via and the first dielectric layer;

forming a resistive switching layer on the bottom electrode;

forming a spacer covering a sidewall of the resistive switching layer and a sidewall of the bottom electrode; and forming a top electrode capping the spacer and the resistive switching layer, wherein the top electrode has an inverted U shaped sectional profile and covers an entire sidewall of the spacer.

11. The method according to claim 10, wherein the conductive via comprises tungsten.

12. The method according to claim 10, wherein the bottom electrode comprises TaN, TiN, Pt, Ir, Ru, or W.

13. The method according to claim 10, wherein the top electrode comprises TiN, TaN, Pt, Ir, or W.

14. The method according to claim 10, wherein the resistive switching layer comprises a hafnium oxide layer and a titanium layer.

15. The method according to claim 10, wherein the spacer has an L-shaped sectional profile.

16. The method according to claim 10, wherein the spacer comprises silicon nitride.

17. The method according to claim 10 further comprising:

forming a second dielectric layer on the top electrode; and forming a contact penetrating through the second dielectric layer, wherein the contact is electrically connected with the top electrode.

18. The method according to claim 17, wherein the contact is not in direct contact with the spacer.

* * * * *